US 9,863,981 B2

(12) United States Patent
Jackum

(10) Patent No.: US 9,863,981 B2
(45) Date of Patent: Jan. 9, 2018

(54) OFFSET NEUTRAL COMPENSATION FOR HIGH-ACCURACY CURRENT SENSING

(71) Applicant: Dialog Semiconductor (UK) Limited, London (GB)

(72) Inventor: Thomas Jackum, Gleisdorf (AT)

(73) Assignee: Dialog Semiconductor (UK) Limited, London (GB)

( * ) Notice: Subject to any disclaimer, the term of this patent is extended or adjusted under 35 U.S.C. 154(b) by 0 days.

(21) Appl. No.: 15/244,342

(22) Filed: Aug. 23, 2016

(65) Prior Publication Data

US 2017/0059629 A1     Mar. 2, 2017

(30) Foreign Application Priority Data

Sep. 2, 2015 (DE) .................. 10 2015 261 796

(51) Int. Cl.
*G01R 17/02* (2006.01)
(52) U.S. Cl.
CPC .................................. *G01R 17/02* (2013.01)
(58) Field of Classification Search
CPC ...................................................... G01R 17/02
USPC ...................................................... 324/140 R
See application file for complete search history.

(56) References Cited

U.S. PATENT DOCUMENTS

| 7,728,565 B2 * | 6/2010 | Wyatt ...................... G05F 1/46 323/269 |
| 8,686,704 B2 * | 4/2014 | Ishii ...................... H02M 3/156 323/284 |
| 2006/0066288 A1 | 3/2006 | Wheeler et al. |

OTHER PUBLICATIONS

German Office Action, File No. 10 2015 216 796.8, Applicant: Dialog Semiconductor (UK) Limited, dated Jan. 1, 2016, 7 pgs. and Engilsh language translation, 9 pgs.
"AC Boosting Compensation Scheme for Low-Power Multistage Amplifiers," by Xiaohong Peng et al, IEEE Journal of Solid-State Circuits, vol. 39, No. 11, Nov. 2004, pp. 2074-2079.

* cited by examiner

*Primary Examiner* — Christopher Mahoney
(74) *Attorney, Agent, or Firm* — Saile Ackerman LLC; Stephen B. Ackerman

(57) ABSTRACT

A circuit and a method for sensing a current flowing from a supply voltage into an electric load are presented. The current sensing circuit comprises a first circuit branch connected between the supply voltage and the electric load, a second circuit branch connected between the supply voltage and ground, and an equalization circuit for equalizing a first voltage drop across a first resistive element and a second voltage drop across a second resistive element and for generating an indication of a current flowing through the second circuit branch.

27 Claims, 3 Drawing Sheets

OFFSET NEUTRAL COMPENSATION FOR HIGH-ACCURACY CURRENT SENSING

TECHNICAL FIELD

This application relates to circuits and methods for sensing a current flowing from a supply voltage into an electric load. The application particularly relates to such circuits and methods that allow for accurate and fast sensing of the current.

BACKGROUND

Current sensing is required for a large array of applications, including load current control e.g. for chargers for portable devices. In such applications, it is important to have available a fast and accurate measurement of how much current is flowing into the load, e.g. for a reliable operation and control of a voltage supply. The requirement of high accuracy of the sense current conventionally makes it necessary to place a low offset, high gain amplifier inside the charge current control loop. However, such high gain, low offset amplifiers tend to be comparably slow. Moreover, conventional architectures tend to have the disadvantage of having poles below the unity gain frequency (UGF), wherein one or more of these poles may be charge current dependent. As a result, loop stability is difficult to achieve if a UGF above a given frequency shall be guaranteed.

Separating current measurement from current control would require provision of two dedicated sense paths and two low offset amplifiers, and therefore increase cost of the overall architecture. Using a fast, high gain and low offset amplifier might not be feasible in view of cost and/or circuit area.

SUMMARY

There is a need for an improved current sensing circuit for sensing a current flowing from a supply voltage into an electric load, and for an improved method of sensing a current flowing from a supply voltage into an electric load. There further is a need for a high bandwidth and low phase shift current sensing circuit. In view of this need, the present document proposes a current sensing circuit for sensing a current flowing from a supply voltage into an electric load and a method of sensing a current flowing from a supply voltage into an electric load, having the features of the respective independent claims.

An aspect of the disclosure relates to a current sensing circuit for sensing a current flowing from a supply voltage into an electric load. The electric load may be a battery, for example. The current sensing circuit may comprise a first circuit branch connected between the supply voltage and the electric load including a first resistive element. The first resistive element may be a transistor element, e.g. a MOS transistor, such as an NMOS or PMOS transistor, for example. A control terminal (e.g. gate terminal) of the transistor element may be connected to ground. The current sensing circuit may further comprise a second circuit branch connected between the supply voltage and ground including a second resistive element. The second resistive element may be a transistor element, e.g. a MOS transistor, such as an NMOS or PMOS transistor, for example. A control terminal (e.g. gate terminal) of the transistor element may be connected to ground. The current sensing circuit may further comprise an equalization circuit for equalizing a first voltage drop across the first resistive element and a second voltage drop across the second resistive element (i.e. for substantially nullifying a difference between the first and second voltage drops) and for generating (outputting) an indication of a current flowing through the second circuit branch (i.e. through the second resistive element). The equalization circuit may receive an indication of a difference between the first and second voltage drops as input. The current sensing circuit may further comprise an AC component generation circuit for generating (outputting) an indication of an AC component of said difference between the first and second voltage drops. This indication may be seen as an indication of an AC component of a difference between a current flowing through the first circuit branch and the current flowing through the second circuit branch. The current sensing circuit may yet further comprise an output node for outputting an indication of a sum of said indication of the current flowing through the second circuit branch and said indication of the AC component of said difference between the first and second voltage drops.

Configured as above, the current sensing circuit comprises a (fast) path for AC stability and response speed, namely a path involving the AC component generation circuit, and a (slow) path for DC accuracy, namely a path involving the equalization circuit. Each of these paths can be optimized individually, allowing for increased leeway in designing the current sensing circuit. Since any DC offset of the AC component generation circuit would not affect the final current measurement result at the output node, the AC component generation circuit can be allowed to have a larger offset compared to the equalization circuit and thus can be designed to be fast compared to the equalization circuit without undue burden. In consequence, the equalization circuit is not required to satisfy both DC accuracy requirements and speed/AC stability requirements, which considerably relaxes design constraints on any (low offset) amplifiers (e.g. operational amplifiers or transconductance amplifiers) of the equalization circuit. The AC component generation circuit can thus be said to take the burden of satisfying loop speed and stability from the design of the equalization circuit. The relaxing of design constraints on the amplifiers of the equalization circuit results in lower complexity (e.g. with regard to area) and lower current consumption. In consequence, fast and accurate current sensing (and thus, current control) can be achieved without imposing severe design constrains on either of the equalization circuit or the AC component generation circuit.

In embodiments, the resistance (resistance value) of the second resistive element may be in a predetermined ratio to the resistance of the first resistive element. Accordingly, for equalized first and second voltage drops, the respective currents flowing through the first and second resistive elements are in a fixed relationship to each other, wherein said relationship depends on the predetermined ratio. Likewise, the currents flowing through the first and second current branches are in a fixed relationship to each other (i.e. are proportional to each other), so that said indication of the current flowing through the second circuit branch may be seen as an indication of a current flowing through the first circuit branch, i.e. from the supply voltage into the electric load. The first and second resistive elements may both be PMOS transistors with their gate terminals connected to each other and connected to ground.

In embodiments, the equalization circuit may comprise a first amplifier for equalizing the first and second voltage drops (e.g. by controlling the second voltage drop). The first amplifier may be an operational amplifier. Alternatively, the first amplifier may be a transconductance amplifier, such as an operational transconductance amplifier (OTA), for example.

In embodiments, the equalization circuit may comprise a current mirror formed by a first variable resistive element and a second variable resistive element. The first and second variable resistive elements may be transistor elements, e.g. MOS transistors, such as NMOS or PMOS transistors, for example, with their respective control terminals connected to each other. The first variable resistive element may be connected in series in the second circuit branch. Said indication of a current flowing through the second circuit branch may depend on a current flowing through the second variable resistive element. The equalization circuit may further comprise a first amplifier (e.g. an operational amplifier, or alternatively, e.g. a transconductance amplifier, such as an OTA, for example) for controlling resistances of the first and second variable resistive elements in dependence on said indication of the difference between the first and second voltage drops. Accordingly, the equalization circuit may be referred to as a feedback circuit. The AC component generation circuit may be referred to as a feedforward circuit.

In embodiments, the current sensing circuit may further comprise a third circuit branch including a series connection of the second variable resistive element and a current source. The output node of the current sensing circuit may be arranged between the current source and the second variable resistive element and may be connected to an output of the AC component generation circuit. Accordingly, a current flowing out of the output node is given by the sum of the current flowing through the second variable resistive element and the current output by the AC component generation circuit.

In embodiments, the AC component generation circuit may comprise a second amplifier that receives said difference between the first and second voltage drops as an input. The second amplifier may be referred to as a feedforward amplifier. The second amplifier may have a larger offset than the first amplifier of the equalization circuit. Accordingly, the second amplifier may be faster than the first amplifier. The second amplifier may be a transconductance amplifier, such as an OTA, for example, that provides a controlled current to the output node.

In embodiments, the AC component generation circuit may comprise a DC decoupling circuit (DC blocking circuit or high pass filter). The AC component generation circuit may thus be said to be AC coupled to the output node. The DC decoupling circuit may comprise a capacitor. The capacitor may be connected in series with the second amplifier. The DC decoupling circuit may further comprise a resistance connected to the capacitor and grounded at its one end, the resistance and the capacitor forming an RC circuit. In this case, the second amplifier (e.g. OTA) is connected to the capacitance and the resistance.

By providing the DC decoupling circuit, any DC offset of the AC component generation circuit would not enter the output of the current sensing circuit and would thus not affect the measurement result of current sensing. Hence, the DC offset of the AC component generation circuit may be large compared to e.g. a DC offset of the equalization circuit (i.e. of an amplifier, e.g. operational amplifier, of the equalization circuit), which allows for a fast implementation of the equalization circuit at reasonable cost and area consumption.

In embodiments, the AC component generation circuit may further comprise a regulating circuit for regulating a voltage at an output of the second amplifier. Accordingly, a desired point of operation of the second amplifier may be ensured regardless of an input to the second amplifier, even for large offset of the second amplifier.

Another aspect of the disclosure relates to a method of sensing a current flowing from a supply voltage into an electric load in a circuit having a first circuit branch connected between the supply voltage and the electric load and a second circuit branch connected between the supply voltage and ground. The electric load may be a battery, for example. The first circuit branch may include a first resistive element. The first resistive element may be a transistor element, e.g. a MOS transistor, such as NMOS or PMOS transistor, for example. A control terminal (e.g. gate terminal) of the transistor element may be connected to ground. The second circuit branch may include a second resistive element and a first variable resistive element connected in series. The second resistive element may be a transistor element, e.g. a MOS transistor, such as NMOS or PMOS transistor, for example. A control terminal (e.g. gate terminal) of the transistor element may be connected to ground. Likewise, the first variable resistive element may be a transistor element, e.g. a MOS transistor, such as NMOS or PMOS transistor, for example. The method may comprise controlling (a resistance of) the first variable resistive element in such a manner that a first voltage drop across the first resistive element and a second voltage drop across the second resistive element are equalized (i.e. a difference between the voltage drops is substantially nullified). The method may further comprise obtaining (generating) an indication of a current flowing through the second circuit branch (i.e. through the second resistive element). The method may further comprise obtaining (generating) an indication of an AC component of a difference between a current flowing through the first circuit branch and the current flowing through the second circuit branch. The method may yet further comprise obtaining (generating and/or outputting) an indication of a sum of said indication of the current flowing through the second circuit branch and said indication of the AC component of the difference between the current flowing through the first circuit branch and the current flowing through the second circuit branch.

In embodiments, the resistance of the second resistive element may be in a predetermined ratio to the resistance of the first resistive element. Then, the current flowing through the second circuit branch is proportional to a current flowing through the first circuit branch for equalized first and second voltage drops.

In embodiments, the circuit may further comprise a current mirror formed by the first variable resistive element and a second variable resistive element. The first variable resistive element may be connected in series in the second circuit branch. The method may further comprise controlling resistances of the first and second variable resistive elements in dependence on said indication of the difference between the first and second voltage drops.

Notably, the method may be applied to any of the circuit sensing circuits described above, e.g. as a method of operating these current sensing circuits.

In embodiments, said indication of the current flowing through the second circuit branch may depend on a current flowing through the second variable resistive element. Due to the proportionality of currents flowing through the first and second circuit branches, the current flowing through the second variable resistance element may also serve as an indication of the current flowing through the first circuit branch, i.e. the load current flowing from the supply voltage into the electric load. Further, due to said proportionality, said indication of the AC component of the difference between the current flowing through the first circuit branch and the current flowing through the second circuit branch may serve as an indication of the AC component of the current flowing through the first circuit branch, i.e. the load current. Thus, said indication of the sum of said indication of the current flowing through the second circuit branch and said indication of the AC component of the difference between the current flowing through the first circuit branch and the current flowing through the second circuit branch that is output by the method may serve as an indication of the load current.

It will be appreciated that method steps and apparatus features may be interchanged in many ways. In particular, the details of the disclosed method can be implemented as an apparatus adapted to execute some or all or the steps of the method, and vice versa, as the skilled person will appreciate.

Moreover, it is understood that methods according to the disclosure relate to methods of operating the current sensing circuits according to the above embodiments and variations thereof.

BRIEF DESCRIPTION OF THE DRAWINGS

Embodiments of the disclosure are explained below in an exemplary manner with reference to the accompanying drawings, wherein FIG. 1 schematically illustrates an example of a circuit for sensing a current flowing from a supply voltage into an electric load, FIG. 2 schematically illustrates an example of a current sensing circuit according to embodiments of the disclosure, and FIG. 3 schematically illustrates another example of a current sensing circuit according to embodiments of the disclosure.

DESCRIPTION

Figure 1:
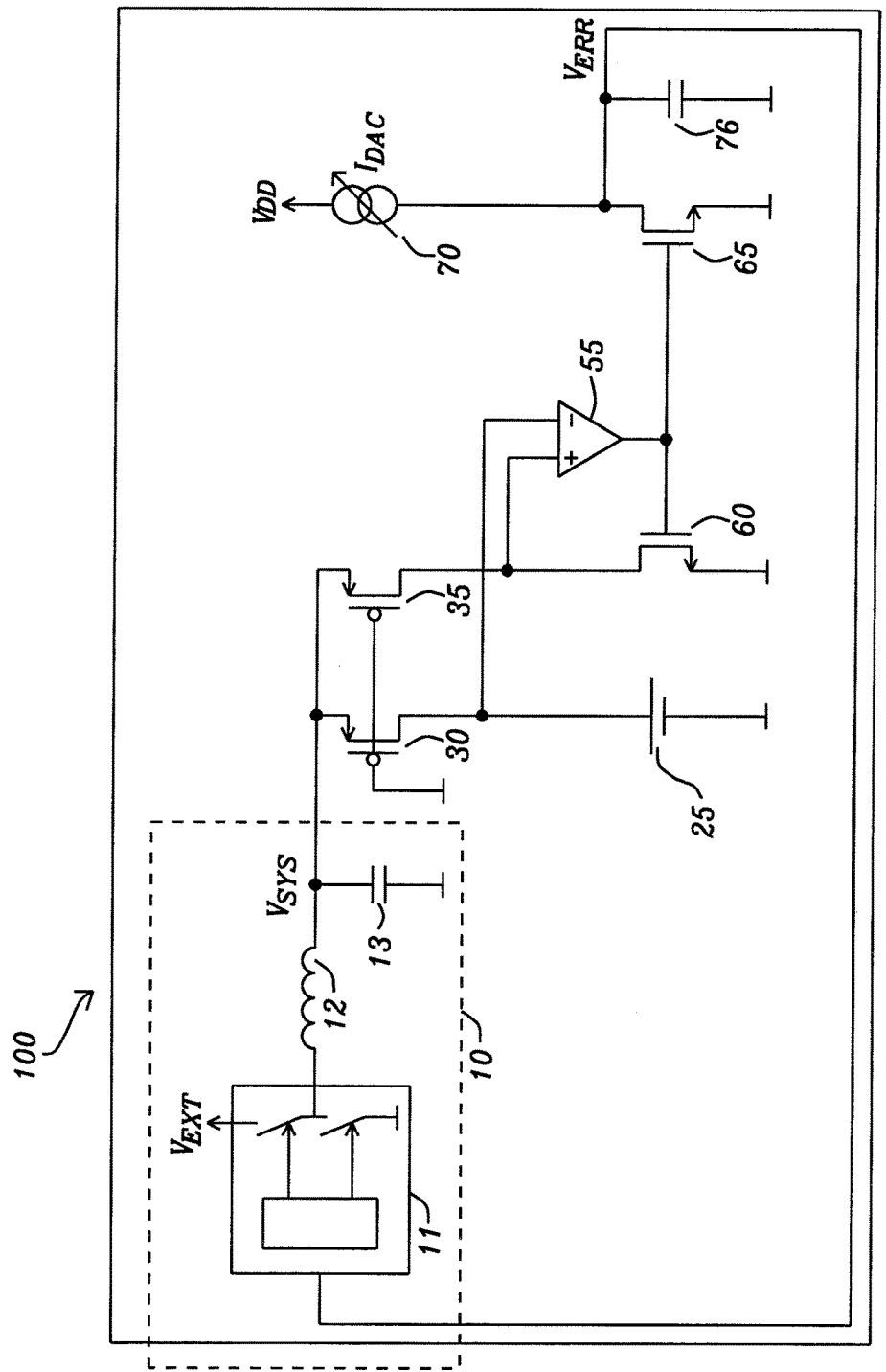

An example for a circuit 100 for sensing a current that flows from a supply voltage V_SYS into an electric load 25 is illustrated in FIG. 1. The supply voltage may be provided by a voltage supply 10, such as a DC-DC converter, for example. The voltage supply 10 may be a buck converter comprising a PWM switching unit 11, an inductance 12, and a capacitance 13, as illustrated in FIG. 1, but the present disclosure is not limited to the case of the voltage supply 10 being a buck converter, and other implementations of the voltage supply 10 shall be contained within the scope of the present disclosure.

The load 25, which may be a battery, such as a battery of a mobile device, for example, may be connected to the supply voltage through a first circuit branch comprising a first resistive element 30. A second circuit branch comprising a second resistive element 35 may be connected in parallel to the first circuit branch e.g. between the supply voltage and ground. The second resistive element 35 may have a resistance (resistance value) R2 that is in a predetermined ratio r1 to the resistance R1 of the first resistive element 30. The ratio r1=R1/R2 may be smaller than one, i.e. the resistance of the second resistive element 35 may be larger than the resistance of the first resistive element 30.

While the first and second resistive elements 30, 35 are illustrated as transistor elements with grounded and/or connected control terminals (e.g. gate terminals) in FIG. 1, alternative implementations of the first and second resistance elements 30, 35 are feasible, such as resistors, for example. In fact, it is sufficient that the first and second resistive elements have resistances (resistance values) with a given ratio (e.g. ratio r1) between them.

The second circuit branch may further comprise a first variable resistive element 60 connected in series with the second resistive element 35, e.g. between the second resistive element 35 and ground.

The circuit 100 may further comprise a first amplifier (e.g. an operational amplifier, as illustrated in FIG. 1) 55. The output terminal of the first amplifier 55 may be connected to a control terminal (e.g. gate terminal) of the first variable resistive element 60. The first amplifier may receive an indication of a difference between a first voltage drop across the first resistive element 30 and a second voltage drop across the second resistive element 35 at its (positive and negative) input ports. Thus, the first amplifier 55 may be said to control the resistance of the first variable resistive element 60 in dependence on said indication of said difference. The first variable resistive element 60 and the first amplifier 55 may be said to form a feedback loop. In particular, the first amplifier 55 may control the resistance of the first variable resistive element 60 so as to equalize the second voltage drop across the second resistive element 35 with the first voltage drop across the first resistive element 30 (i.e. to substantially nullify said difference between the first and second voltage drops).

For a state in which the first and second voltage drops are equalized by control operation of the first amplifier 55, a first current (load current) I_LOAD flowing through the first resistive element 30 may be in a fixed relationship to a second current (sense current) I_SENSE_INT flowing through the second resistive element 35. In particular, the second current I_SENSE_INT may be proportional to the first current, e.g. may be given by I_SENSE_INT=I_LOAD·r1, where r1=R1/R2 is the ratio between the resistances of the first and second resistive elements 30, 35.

The circuit 100 may further comprise a second variable resistive element 65 that forms a current mirror with the first variable resistive element 60. Respective control terminals (e.g. gate terminals) of the first and second variable resistive elements 60, 65 may be connected to each other. Accordingly, also the control terminal of the second variable resistive element 65 may be connected to the output port of the first amplifier 55, and the resistance of the second variable resistive element 65 may be controlled by the first amplifier 55. The first and second variable resistive elements 60, 65 may have different dimensions so that a third current I_SENSE_INT' flowing through the second variable resistive element 65 may be in a second predetermined ratio r2 to the second current I_SENSE_INT flowing through the first variable resistive element 60. Thus, one may have I_SENSE_INT'=r2·I_SENSE_INT=r1·r2·I_LOAD for known predetermined ratios r1, r2. In other words, the third current I_SENSE_INT' may depend on (e.g. may be proportional to) the first current I_LOAD.

The first and second variable resistive elements 60, 65 may be transistor elements, e.g. MOS transistors, such as NMOS transistors, for example, as illustrated in FIG. 1. Alternatively, depending on implementation, the first and second variable resistance elements 60, 65 may be PMOS transistors. In general however, it suffices for the first and second variable resistive elements 60, 65 to each have a variable and controllable resistance to enable controlling a current flowing through the second variable resistive element 65 to be in a fixed relationship to the current flowing through the first variable resistive element 65. Alternative implementations include variable resistors, for example.

The second variable resistive element 65 may be arranged in a third circuit branch connected between a predetermined voltage level (e.g. V_DD) and ground. The third circuit branch may comprise a current source 70 for generating (sourcing) a constant current. Without limitation, the current source 70 may be a controllable current source, such as an IDAC, for example. The constant current I_DAC output by the current source 70 may be set to a desired value (target value) for the load current I_LOAD. Then, a current I_ERR that is tapped at an intermediate node between the current source 70 and the second variable resistive element 65 corresponds to the difference between the current I_DAC output by the current source 70 and the third current I_SENSE_INT' flowing through the second variable resistive element 65 and may serve as an indication of the first current (load current) I_LOAD. The current I_ERR may be converted to a voltage V_ERR for current control (e.g. control of the voltage supply 10) by charging a capacitor 76 by said current I_ERR and tapping the voltage across the capacitor 76.

As indicated above, the voltage V_ERR (or alternatively, the current I_ERR) may be used to control the voltage supply 10 to thereby control (adjust) the supply voltage V_SYS, and, accordingly, the load current. In this case, a feedback loop for load current control as illustrated in FIG. 1 would be formed. In an alternative implementation, the voltage V_ERR (or alternatively, the current I_ERR) may be used to control the resistance value of the first resistive element 30 (which may be a MOS transistor, such as a PMOS transistor or an NMOS transistor, for example), e.g. by feeding a voltage to the control terminal (e.g. gate terminal) of the first resistive element 30, to thereby control the load current. Further, the voltage V_ERR (or alternatively, the current I_ERR) may be used to control the resistance value of the second resistive element 35 (which may be a MOS transistor, such as a PMOS transistor or an NMOS transistor, for example), e.g. by feeding a voltage to the control terminal (e.g. gate terminal) of the second resistive element 35, to thereby retain the ratio r1 between the resistance value of the second resistive element 35 and the resistance value of the first resistive element 30. In general, the current I_ERR or voltage V_ERR derived therefrom may be used to control the load current.

Next, embodiments of the disclosure will be described with reference to FIG. 2 and FIG. 3.

Broadly speaking, the underlying concept of embodiments of the disclosure is to split the single feedback loop of FIG. 1 into two or more loops, e.g. a slow DC loop and a fast AC coupled loop. By splitting the single feedback loop into the two or more loops, the different loops can be designed to dominate (i.e. satisfy) different overall loop performance requirements such as DC accuracy and AC stability/speed, and the loops can be optimized individually in view of their respective design requirements. This can yield a superior design (e.g. better DC accuracy and faster response for a given power dissipation in the control circuits) when compared to the single-loop design for which the single loop must be designed to meet all performance targets simultaneously.

Figure 2:
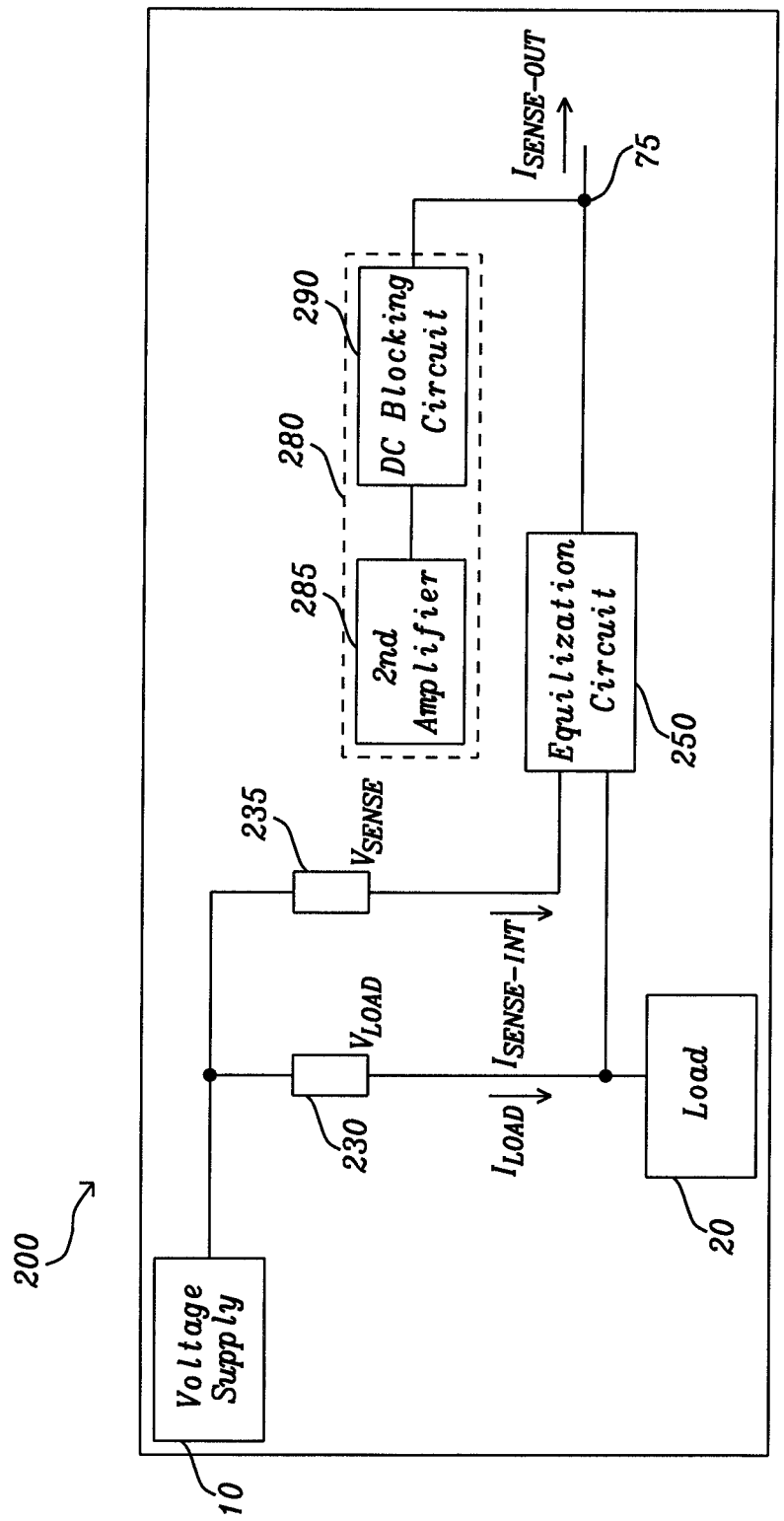

FIG. 2 schematically illustrates an example of a current sensing circuit 200 according to embodiments of the disclosure. The current sensing circuit 200 may be connected between a voltage supply 10 (e.g. the voltage supply 10 of FIG. 1) and an electric load 20, and may output an output current I_SENSE_OUT at an output node 75. The output current I_SENSE_OUT may be an indication of (e.g. may be proportional to) the load current I_LOAD and may be used for controlling the voltage supply 10, for example.

The current sensing circuit 200 may comprise a first circuit branch including a first resistive element 230 connected between a supply voltage and the electric load 20, as well as a second circuit branch including a second resistive element 235 e.g. connected in parallel to the first circuit branch. The first and second resistive elements 230, 235 may be transistor elements, e.g. MOS transistors, such as PMOS transistors or NMOS transistors, for example. The current sensing circuit 200 may further comprise an equalization circuit 250 for equalizing a first voltage drop across the first resistive element 230 and a second voltage drop across the second resistive element 235, as explained above in connection with FIG. 1. The equalization circuit 250 may be further adapted to generate (output) an indication of a current flowing through the second circuit branch (i.e. through the second resistive element 235). Said indication may be a current or voltage depending on (e.g. being proportional to) the current flowing through the second circuit branch. The equalization circuit 250 may receive an indication of said difference between the first and second voltage drops as an input. Further, an output terminal of the equalization circuit 250 may be connected to the output node 75 of the current sensing circuit 200. The current sensing circuit 200 may further comprise an AC component generation circuit 280 for generating an indication of an AC component of said difference between the first and second voltage drops. Said indication may be current or voltage depending on (e.g. being proportional to) the AC component of said difference between the first and second voltage drops. To this end, the AC component generation circuit 280 may receive an indication of said difference as an input. For example, the AC component generation circuit 280 and the equalization circuit 250 may receive the same input, however, for example, in reverse polarity (i.e. inputs to positive and negative input ports of the equalization circuit 250 and the AC component generation circuit 280 may be swapped). Further, the AC component generation circuit 280 may be connected to the output node 75 of the current sensing circuit 200.

In this configuration, the overall output current I_SENSE_OUT of the current sensing circuit 200 depends on (e.g. is given by the sum of) the current output by the equalization circuit 250 and the current output by the AC component generation circuit 280. In more general terms, an indication of a sum of the indication of the current flowing through the second circuit branch and the indication of the AC component of said difference between the first and second voltage drops is output at the output node 75.

The AC component generation circuit 280 may comprise a second amplifier (feedforward amplifier) 285 and a DC decoupling circuit (DC blocking circuit) 290 arranged between the second amplifier 285 and the output node 75. The second amplifier 285 may generate (output) a current that depends on (e.g. is proportional to) said difference between the first and second voltage drops. For example, the second amplifier 285 may be a transconductance amplifier, such as an OTA. The DC decoupling circuit 290 may be adapted to block any DC component of the output (e.g. current) of the second amplifier 285, so that only the AC component of said output (e.g. current) is fed to the output node 75. The second amplifier 285 may thus be said to be AC coupled to the output node 75 and the AC component generation circuit 280 may be referred to as an AC coupled feed-forward path to the output node 75.

Although not illustrated in FIG. 2, the AC component generation circuit 280 may comprise a regulating circuit for regulating a voltage at an output of the second amplifier 285, e.g. to a predetermined voltage level. The regulating circuit may comprise a controllable current source and may serve to maintain a desired DC operating point (e.g. non-saturated output) for the second amplifier 285. The regulating circuit may be slow compared to the second amplifier 285. Then, due to the presence of the DC decoupling circuit 290, regulation by the regulation circuit will not affect the current that is fed to the output node 75 by the AC component generation circuit 280.

Since any DC component of the current output by the second amplifier 285 is blocked by the DC decoupling circuit 290 and may not influence the output current I_SENSE_OUT that is output at the output node 75, the second amplifier 285 is not required to have a small offset. Due to this relaxation of design requirements with regard to the offset, the second amplifier 285 may be implemented to be comparably fast without undue burden. On the other hand, as the high frequency behavior of the difference between the first and second voltage drops is captured by the AC component generation circuit 280, the equalization circuit 250 is not required to be particularly fast. Put differently, connecting the fast AC component generation circuit 280 directly to the output node 75 allows for providing a comparably slow nested loop including the equalization circuit 250 for regulating (i.e. equalizing) the difference between the first and second voltage drops without compromising overall response speed (AC stability) of the current sensing circuit 200. Due to this relaxation of design requirements with regard to response speed, the equalization circuit 250 and any amplifiers (e.g. operational amplifiers) contained therein may be implemented to be comparably accurate (i.e. have a small offset) without undue burden.

The overall output current I_SENSE_OUT or a quantity derived therefrom (e.g. a voltage) may be used to control the voltage supply 10 to thereby control (adjust) the supply voltage V_SYS, as indicated above in connection with FIG. 1. Alternatively, the overall output current I_SENSE_OUT or the quantity derived therefrom may be used to control the resistance value of the first resistive element 230 (which may be a MOS transistor, such as a PMOS transistor or an NMOS transistor, for example), as indicated above in connection with FIG. 1, to thereby control the load current. Further, the overall output current I_SENSE_OUT or the quantity derived therefrom may be used to control the is resistance value of the second resistive element 235 (which may be a MOS transistor, such as a PMOS transistor or an NMOS transistor, for example), as indicated above in connection with FIG. 1, in order to retain the ratio r1 between the resistances (resistance values) of the second and first resistive elements 235, 230. In general, the overall output current I_SENSE_OUT or the quantity derived therefrom may be used to control the load current.

Figure 3:
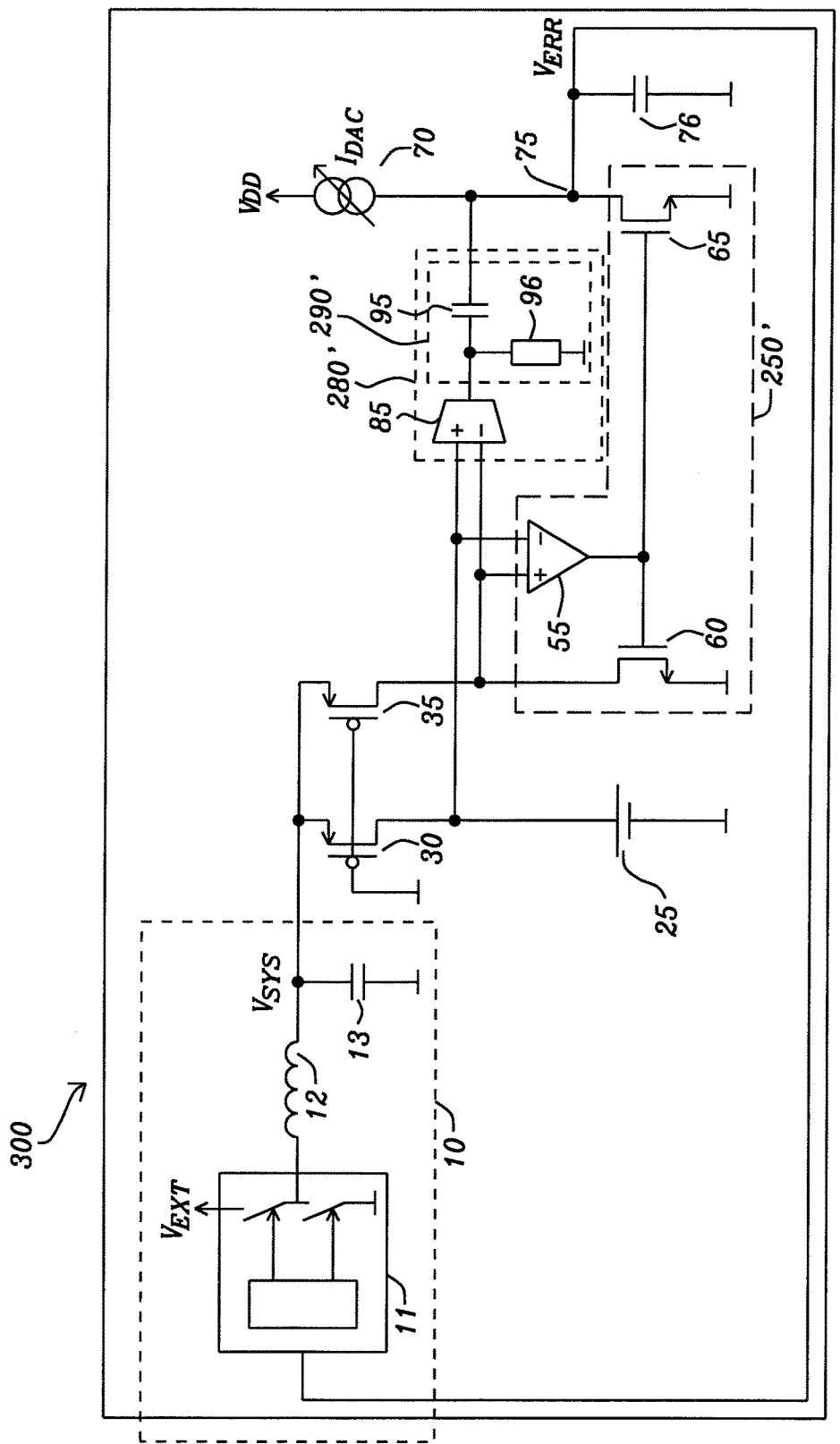

FIG. 3 schematically illustrates another example of a current sensing circuit 300 according to embodiments of the disclosure. The current sensing circuit 300 may be seen as an exemplary implementation of the current sensing circuit 200 of FIG. 2. Notably, single or plural details of implementation of the below description may be employed in the context of the current sensing circuit 200, without the necessity to employ each and every detail of implementation. Moreover, unless indicated otherwise, like numbered elements in FIG. 1 and FIG. 3 are identical and repeated description thereof will be omitted for reasons of conciseness. Notably, the current source 70 and the capacitor 76 in FIG. 3 are optional and may be omitted.

Compared to the circuit 100 of FIG. 1, the current sensing circuit 300 additionally comprises an operational transconductance amplifier, OTA 85 and a DC decoupling circuit 290'. The OTA 85 is a non-limiting example for the second amplifier 285 in FIG. 2. The OTA 85 (or, in general, the second amplifier) may receive an indication of the difference between the first and second voltage drops across the first and second resistive elements 30, 35, respectively, as an input. For example, the OTA 85 may receive respective voltage drops at its positive and negative input ports. The current that is output by the OTA 85 may depend on said difference between the first and second voltage drops.

The DC decoupling circuit 290' may comprise a capacitor 95 connected in series between the second amplifier 85 and the output node 75 as well as a resistor 96 connected in parallel to the capacitor 95, i.e. between an intermediate node between the second amplifier 85 and the capacitor 96, and ground. The resistor 96 is optional and may be omitted. The DC decoupling circuit 290' is a non-limiting example of the DC decoupling circuit 290 in FIG. 2. The AC component generation circuit 280' formed by the second amplifier 85 and the DC decoupling circuit 290' is a non-limiting example of the AC component generation circuit 280 in FIG. 2. Notably, the current output by the AC component generation circuit 280' is the current flowing through the capacitor 95, i.e. the AC component of the current output by the second amplifier 85. Thus, the output terminal of the equalization circuit 250' may be arranged at a terminal (e.g. drain terminal) of the second variable resistive element 65.

The equalization circuit 250' comprising the first amplifier (e.g. operational amplifier) 55, first variable resistive element 60 and second variable resistive element 65 (i.e. the first amplifier 55 and the current mirror) is a non-limiting example of the equalization circuit 250 in FIG. 2. Notably, the current output by the equalization circuit 250' is the current flowing through the second variable resistive element 65.

As indicated above, using a high speed but inaccurate AC coupled circuit (i.e. AC component generation circuit 280) to bypass the highly accurate/low offset current sensing stage (i.e. the equalization circuit 250) significantly relaxes design requirements of the high accuracy amplifier (e.g. operational amplifier) of the current sensing stage and the current mirror. For example, the current mirror can be made large for matching and therefore may have a big gate capacitance. Notably, according to embodiments of the disclosure, the second amplifier 85 of the AC component generation circuit 280 (feedforward path) is not arranged in parallel to the first amplifier 55 of the equalization circuit 250, but is connected directly (e.g. via the DC decoupling circuit 290) to the output node 75. Put differently, while the first amplifier 55 and the second amplifier 85 may receive the same input (however, for example in reverse polarity), they have different functions in that the first amplifier 55 regulates the difference between the first and second voltage drops, and the second amplifier 85 is AC coupled to the output node.

It should be noted that the apparatus features described above correspond to respective method features that may however not be explicitly described, for reasons of conciseness. The disclosure of the present document is considered to extend also to such method features. In particular, the present disclosure is understood to relate to methods of operating the circuits described above.

It should further be noted that the description and drawings merely illustrate the principles of the proposed apparatus. Those skilled in the art will be able to implement various arrangements that, although not explicitly described or shown herein, embody the principles of the invention and are included within its spirit and scope. Furthermore, all examples and embodiment outlined in the present document are principally intended expressly to be only for explanatory purposes to help the reader in understanding the principles of the proposed method. Furthermore, all statements herein providing principles, aspects, and embodiments of the invention, as well as specific examples thereof, are intended to encompass equivalents thereof.

What is claimed is:

1. Current sensing circuit for sensing a current flowing from a supply voltage into an electric load, the current sensing circuit comprising:
   a first circuit branch connected between the supply voltage and the electric load including a first resistive element;
   a second circuit branch connected between the supply voltage and ground including a second resistive element;
   an equalization circuit for equalizing a first voltage drop across the first resistive element and a second voltage drop across the second resistive element and for generating an indication of a current flowing through the second circuit branch, wherein the equalization circuit receives an indication of a difference between the first and second voltage drops as input;
   an AC component generation circuit for generating an indication of an AC component of said difference between the first and second voltage drops; and
   an output node for outputting an indication of a sum of said indication of the current flowing through the second circuit branch and said indication of the AC component of said difference between the first and second voltage drops.

2. The current sensing circuit according to claim 1, wherein the resistance of the second resistive element is in a predetermined ratio to the resistance of the first resistive element.

3. The current sensing circuit according to claim 1, wherein the equalization circuit comprises a first amplifier for equalizing the first and second voltage drops.

4. The current sensing circuit according to claim 1,
   wherein the equalization circuit comprises a current mirror formed by a first variable resistive element and a second variable resistive element;
   wherein the first variable resistive element is connected in series in the second circuit branch; and
   wherein said indication of a current flowing through the second circuit branch depends on a current flowing through the second variable resistive element.

5. The current sensing circuit according to claim 4, wherein the first and second variable resistive elements are transistor elements with their respective control terminals connected to each other.

6. The current sensing circuit according to claim 4, further comprising a first amplifier for controlling resistances of the first and second variable resistive elements in dependence on said indication of the difference between the first and second voltage drops.

7. The current sensing circuit according to claim 4, further comprising a third circuit branch including a series connection of the second variable resistive element and a current source,
   wherein the output node is arranged between the current source and the second variable resistive element and is connected to an output of the AC component generation circuit.

8. The current sensing circuit according to claim 7, wherein the AC component generation circuit further comprises a regulating circuit for regulating a voltage at an output of the second amplifier.

9. The current sensing circuit according to claim 1, wherein the AC component generation circuit comprises a second amplifier that receives said difference between the first and second voltage drops as an input.

10. The current sensing circuit according to claim 9, wherein the second amplifier is a transconductance amplifier.

11. The current sensing circuit according to claim 1, wherein the AC component generation circuit comprises a DC decoupling circuit.

12. The current sensing circuit according to claim 11, wherein the decoupling circuit comprises a capacitor.

13. A method of sensing a current flowing from a supply voltage into an electric load in a circuit having a first circuit branch connected between the supply voltage and the electric load and a second circuit branch connected between the supply voltage and ground, wherein the first circuit branch includes a first resistive element, and the second circuit branch includes a second resistive element and a first variable resistive element, the method comprising:
   controlling the first variable resistive element in such a manner that a first voltage drop across the first resistive element and a second voltage drop across the second resistive element are equalized;
   obtaining an indication of a current flowing through the second circuit branch;
   obtaining an indication of an AC component of a difference between a current flowing through the first circuit branch and the current flowing through the second circuit branch; and
   obtaining, as an indication of the current flowing from the supply voltage into the electric load, an indication of a sum of said indication of the current flowing through the second circuit branch and said indication of the AC component of the difference between the current flowing through the first circuit branch and the current flowing through the second circuit branch.

14. The method according to claim 13,
   wherein the circuit comprises a current mirror formed by the first variable resistive element and a second variable resistive element; and
   the method further comprises controlling resistances of the first and second variable resistive elements in dependence on said indication of the difference between the first and second voltage drops.

15. The method according to claim 14, wherein said indication of the current flowing
   through the second circuit branch depends on a current flowing through the second variable resistive element.

16. A method for sensing a current flowing from a supply voltage into an electric load, comprising the steps of:
   connecting a first circuit branch between the supply voltage and the electric load including a first resistive element;
   connecting a second circuit branch between the supply voltage and ground including a second resistive element;

equalizing a first voltage drop across the first resistive
element and a second voltage drop across the second
resistive element;

generating an indication of a current flowing through the
second circuit branch, wherein the equalization circuit
receives an indication of a difference between the first
and second voltage drops as input;

generating an indication of an AC component of said
difference between the first and second voltage drops;
and outputting an indication of a sum of said indication of the
current flowing through the second circuit branch and
said indication of the AC component of said difference
between the first and second voltage drops.

17. The method according to claim 16, wherein the resistance of the second resistive element is in a predetermined ratio to the resistance of the first resistive element.

18. The method according to claim 16, wherein the equalization circuit comprises a first amplifier for equalizing the first and second voltage drops.

19. The method according to claim 16,
wherein the equalization circuit comprises a current mirror formed by a first variable resistive element and a second variable resistive element;
wherein the first variable resistive element is connected in series in the second circuit branch; and
wherein said indication of a current flowing through the second circuit branch depends on a current flowing through the second variable resistive element.

20. The method according to claim 19, wherein the first and second variable resistive elements are transistor elements with their respective control terminals connected to each other.

21. The method according to claim 19, further comprising the step of:
controlling resistances of the first and second variable resistive elements in dependence on said indication of the difference between the first and second voltage drops.

22. The method according to claim 19, further comprising a third circuit branch including a series connection of the second variable resistive element and a current source,
wherein the output node is arranged between the current source and the second variable resistive element and is connected to an output of the AC component generation circuit.

23. The method according to claim 22, wherein the AC component generation circuit further comprises a regulating circuit for regulating a voltage at an output of the second amplifier.

24. The method according to claim 16, wherein the AC component generation circuit comprises a second amplifier that receives said difference between the first and second voltage drops as an input.

25. The method according to claim 24, wherein the second amplifier is a transconductance amplifier.

26. The method according to claim 16, wherein the AC component generation circuit comprises a DC decoupling circuit.

27. The method according to claim 26, wherein the DC decoupling circuit comprises a capacitor.

* * * * *